(12) United States Patent
Tao et al.

(10) Patent No.: US 11,043,502 B2
(45) Date of Patent: *Jun. 22, 2021

(54) SEMICONDUCTOR DEVICES INCLUDING FERROELECTRIC MATERIALS

(71) Applicant: Micron Technology, Inc., Boise, ID (US)

(72) Inventors: Qian Tao, Boise, ID (US); Matthew N. Rocklein, Boise, ID (US); Beth R. Cook, Meridian, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/550,983

(22) Filed: Aug. 26, 2019

(65) Prior Publication Data

US 2019/0386015 A1 Dec. 19, 2019

Related U.S. Application Data

(60) Continuation of application No. 16/059,672, filed on Aug. 9, 2018, now Pat. No. 10,403,630, which is a
(Continued)

(51) Int. Cl.
*H01L 27/11507* (2017.01)
*H01L 49/02* (2006.01)
*H01L 45/00* (2006.01)

(52) U.S. Cl.
CPC ........ *H01L 27/11507* (2013.01); *H01L 28/60* (2013.01); *H01L 45/04* (2013.01);
(Continued)

(58) Field of Classification Search
None
See application file for complete search history.

(56) References Cited

U.S. PATENT DOCUMENTS

| 5,087,593 A | 2/1992 | Narula |
| 5,242,860 A | 9/1993 | Nulman et al. |

(Continued)

FOREIGN PATENT DOCUMENTS

| JP | 63-301558 A | 12/1988 |
| JP | 2001-029399 A | 2/2001 |

(Continued)

OTHER PUBLICATIONS

Boscke et al., Ferroelectricity in Hafnium Oxide Thin Films, Applied Physics Letters, vol. 99, (2011), pp. 102903-1-102903-3.
(Continued)

*Primary Examiner* — Dung A. Le
(74) *Attorney, Agent, or Firm* — TraskBritt

(57) ABSTRACT

A method of forming a ferroelectric memory cell. The method comprises forming an electrode material exhibiting a desired dominant crystallographic orientation. A hafnium-based material is formed over the electrode material and the hafnium-based material is crystallized to induce formation of a ferroelectric material having a desired crystallographic orientation. Additional methods are also described, as are semiconductor device structures including the ferroelectric material.

18 Claims, 5 Drawing Sheets

Related U.S. Application Data continuation of application No. 15/459,136, filed on Mar. 15, 2017, now Pat. No. 10,062,703, which is a continuation of application No. 14/936,013, filed on Nov. 9, 2015, now Pat. No. 9,698,343, which is a division of application No. 14/026,883, filed on Sep. 13, 2013, now Pat. No. 9,231,206.

(52) U.S. Cl.
CPC .......... *H01L 45/1253* (2013.01); *H01L 45/14* (2013.01); *H01L 45/147* (2013.01); *H01L 45/1608* (2013.01); *H01L 45/1641* (2013.01)

(56) References Cited

U.S. PATENT DOCUMENTS

| | | | |
|---|---|---|---|
| 6,198,119 | B1 | 3/2001 | Nabatame et al. |
| 6,664,578 | B2 | 12/2003 | Lee et al. |
| 7,485,473 | B2 | 2/2009 | Tamura |
| 7,514,272 | B2 | 4/2009 | Fukada et al. |
| 7,781,813 | B2 | 8/2010 | Tamura et al. |
| 7,927,889 | B2 | 4/2011 | Mitsui |
| 9,231,206 | B2 | 1/2016 | Tao et al. |
| 9,698,343 | B2 * | 7/2017 | Tao .................. H01L 45/147 |
| 10,403,630 | B2 * | 9/2019 | Tao .................. H01L 45/14 |
| 2004/0004237 | A1 | 1/2004 | Fox |
| 2006/0157754 | A1 | 7/2006 | Jeon et al. |
| 2007/0080382 | A1 | 4/2007 | Kikuchi et al. |
| 2007/0099375 | A1 | 5/2007 | Kim et al. |
| 2007/0243640 | A1 | 10/2007 | Tamura |
| 2007/0275484 | A1 | 11/2007 | Mitsui |
| 2008/0062615 | A1 | 3/2008 | Rappe et al. |
| 2009/0057737 | A1 | 3/2009 | Boescke et al. |
| 2009/0261395 | A1 | 10/2009 | Boescke |
| 2009/0309188 | A1 | 12/2009 | Wang |
| 2012/0248397 | A1 | 10/2012 | Nakagawa et al. |
| 2013/0043452 | A1 | 2/2013 | Meyer et al. |
| 2013/0256623 | A1 | 10/2013 | Kim et al. |
| 2014/0070289 | A1 | 3/2014 | Tanaka et al. |
| 2014/0355328 | A1 | 12/2014 | Muller et al. |
| 2015/0076437 | A1 | 3/2015 | Tao et al. |
| 2016/0005961 | A1 | 1/2016 | Ino |
| 2016/0064655 | A1 | 3/2016 | Tao et al. |

FOREIGN PATENT DOCUMENTS

| | | |
|---|---|---|
| JP | 2001-135798 A | 5/2001 |
| JP | 2010-118443 A | 5/2010 |
| JP | 2012-256850 A | 12/2012 |
| JP | 2015-015334 A | 1/2015 |
| KR | 10-2003-0013587 A | 2/2003 |
| TW | 201128767 A | 8/2011 |

OTHER PUBLICATIONS

Boscke et al., Phase Transitions in Ferroelectric Silicon Doped Hafnium Oxide, Applied Physics Letters, vol. 99, (2011), pp. 112904-1-112904-3.

Boscke T S et al: "Ferroelectricity in hafnium oxide: CMOS compatible ferroelectric field effect transistors", Electron Devices Meeting (IEDM), 2011 IEEE International, IEEE, Dec. 5, 2011 (Dec. 5, 2011), pp. 24.5.1-24.5.4.

Chinese Office Action from Chinese Application No. 201480049629.3, dated Jan. 25, 2018, 13 pages.

European Examination Report from European Application No. 14844328.6, dated Nov. 10, 2017, 4 pages.

European Extended Search Report from European Application No. 14844328.6, dated Mar. 21, 2017, 7 pages.

International Preliminary Report on Patentability for International Application No. PCT/US2014/052815, dated Mar. 15, 2016, seven (7) pages.

International Search Report of the ISA/KR, International Application No. PCT/US2014/052815, dated Dec. 10, 2014, three (3) pages.

Japanese Office Action from Japanese Application No. 2016-541993, dated Mar. 16, 2017, 7 pages.

Japanese Search Report from Japanese Application No. 2016-541993, dated Feb. 1, 2017, 29 pages with English Translation.

Korean Preliminary Rejection from Korean Application No. 10-2016-7005827, dated Feb. 20, 2017, 10 pages with English translation.

Korean Written Opinion from Korean Application No. 10-2016-7005827, dated Feb. 20, 2017, 9 pages with English translation.

Mueller et al., Incipient Ferroelectricity in Al-Doped HfO2 Thin Films, Adv. Funct. Mater. (2012), 6 pages.

Nguyen et al., Sub-Bandgap States in Polycrystalline Hafnium Oxide and Their Suppression by Admixture of Silicon, Applied Physics Letters, vol. 87, (2005), pp. 192903-1-192903-3.

Office Action and Search Report dated Oct. 28, 2015 in Taiwanese Application No. 103131228, 6 pages.

Schroeder et al., Hafnium Oxide Based CMOS Compatible Ferroelectric Materials, ECS Journal of Solid State Science and Technology, vol. 2, No. 4, (2013), pp. N69-N72.

Setter et al., Ferroelectric Thin Films: Review of Materials, Properties, and Applications, Journal of Applied Physics, vol. 100, (2006), pp. 051606-1-051606-46.

Written Opinion of the International Search Authority, ISA/KR, International Application No. PCT/US2014/052815, dated Dec. 10, 2014, six (6) pages.

Yurchuk E et al: "HfO2-Based Ferroelectric Field-Effect Transistors with 260 nm Channel Length and Long Data Retention", Memory Workshop (IMW), 2012 4th IEEE International, IEEE, May 20, 2012 (May 20, 2012), pp. 1-4.

European Communication Under Rule 71(3) EPC for European Application No. 14844328.6, dated Feb. 12, 2021, 8 pages.

* cited by examiner

SEMICONDUCTOR DEVICES INCLUDING FERROELECTRIC MATERIALS

CROSS-REFERENCE TO RELATED APPLICATIONS

This application is a continuation of U.S. patent application Ser. No. 16/059,672, filed Aug. 9, 2018, now U.S. Pat. No. 10,403,630, issued Sep. 3, 2019, which is a continuation of U.S. patent application Ser. No. 15/459,136, filed Mar. 15, 2017, now U.S. Pat. No. 10,062,703, issued Aug. 28, 2018, which is a continuation of U.S. patent application Ser. No. 14/936,013, filed Nov. 9, 2015, now U.S. Pat. No. 9,698,343, issued Jul. 4, 2017, which is a divisional of U.S. patent application Ser. No. 14/026,883, filed Sep. 13, 2013, now U.S. Pat. No. 9,231,206, issued Jan. 5, 2016, the disclosure of each of which is hereby incorporated herein in its entirety by this reference.

TECHNICAL FIELD

Embodiments of the disclosure relate to the field of semiconductor device design and fabrication. More specifically, embodiments of the disclosure relate to methods of forming a ferroelectric (FE) memory cell including a FE material on an electrode material, and to related semiconductor device structures.

BACKGROUND

Lead zirconate titanate (PZT) has been investigated as a FE material for use in non-volatile data storage, such as FE Random Access Memory (FERAM). However, PZT is not compatible with conventional semiconductor processing techniques and is not scalable because the PZT loses its FE properties at lower thicknesses and, therefore, has integration issues.

Hafnium silicate ($HfSiO_x$) is a high-k dielectric material and has been investigated as a replacement ferroelectric material for PZT. Hafnium silicate is polymorphic and may form in monoclinic, tetragonal, cubic, or orthorhombic crystal structures, with each of the crystal structures having multiple possible crystallographic orientations, such as the (111) or (200) crystallographic orientations. Hafnium silicate is conventionally formed with the (111) crystallographic orientation being the dominant formed crystallographic orientation.

Titanium nitride is a polymorphic material and may form many crystal structures, with each crystal structure having multiple possible crystallographic orientations, such as the (001), (002), (100), (110), (111), or (200) crystallographic orientations. Titanium nitride is conventionally formed in the cubic phase and has multiple crystallographic orientations, with the (200) crystallographic orientation often being the dominant formed crystallographic orientation.

It would be desirable to have improved methods of forming hafnium silicate or other FE materials, such that a desired crystallographic orientation of the ferroelectric material can be achieved.

DETAILED DESCRIPTION

Figure 1:
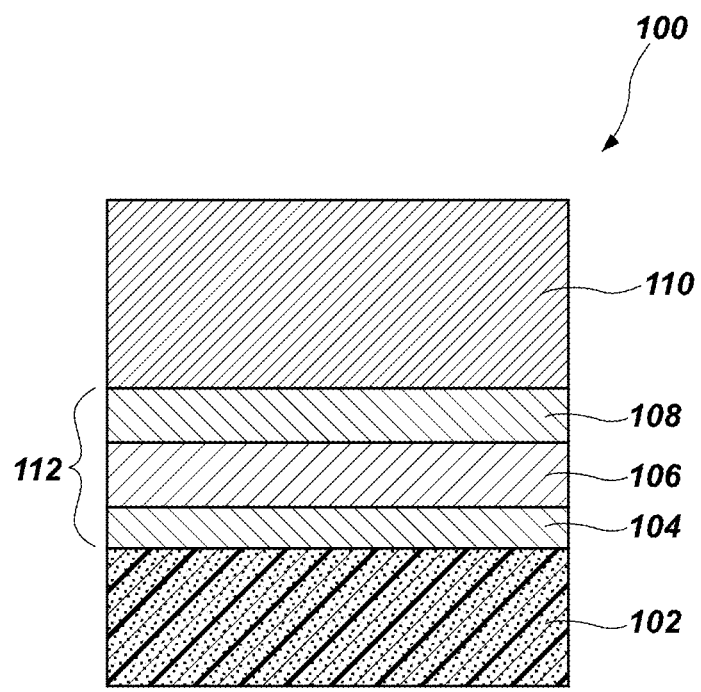
FIG. 1 is a partial cross-sectional view of a semiconductor device structure in accordance with an embodiment of the present disclosure.

Methods of forming a ferroelectric memory cell are disclosed, as are related semiconductor device structures including a ferroelectric material and an electrode material. The ferroelectric material may be crystallized in a desired crystallographic orientation. The desired crystallographic orientation of the ferroelectric material may be achieved by forming the electrode material at a desired crystallographic orientation, forming a hafnium-based material over the electrode material, and crystallizing the hafnium-based material to produce a ferroelectric material. Thus, the electrode material may function as a template to induce formation of the desired crystallographic orientation of the ferroelectric material.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided herein does not form a complete process flow for forming a semiconductor device structure, and each of the semiconductor device structures described below do not form a complete semiconductor device. Only those process acts and structures necessary to understand the embodiments of the disclosure are described in detail below. Additional acts to form a complete semiconductor device may be performed by conventional fabrication techniques. Also note, any drawings accompanying the present application are for illustrative purposes only, and are thus not drawn to scale. Additionally, elements common between figures may retain the same numerical designation.

As used herein, the singular forms "a," "an," and "the" are intended to include the plural forms as well, unless the context clearly indicates otherwise.

As used herein, relational terms, such as "first," "second," "top," "bottom," "upper," "lower," "over," "under," etc., are used for clarity and convenience in understanding the disclosure and accompanying drawings and do not connote or depend on any specific preference, orientation, or order, except where the context clearly indicates otherwise.

As used herein, the term "substrate" means and includes a foundation material or construction upon which components, such as those within a semiconductor device structure are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in or on the base semiconductor structure or foundation.

As used herein, the term "ferroelectric" means and includes a material having a spontaneous electric polarization (electric dipole) that can be reversed in the presence of an electric field.

As used herein, the term "dominant" in reference to a crystallographic orientation of a material means and includes a material exhibiting a specified crystallographic orientation at a relatively greater amount than any other crystallographic orientation. By way of non-limiting example, a "dominant (111) crystallographic orientation" means the material exhibits the (111) crystallographic orientation at a greater amount than any other crystallographic orientation.

As used herein, the term "hafnium silicate" means and includes a material including hafnium, silicon, and oxygen atoms. For convenience, the composition of the material may be abbreviated by "$HfSiO_x$," which does not indicate the stoichiometry of the hafnium, silicon, and oxygen atoms.

As used herein, the term "hafnium aluminate" means and includes a material including hafnium, aluminum, and oxygen atoms. For convenience, the composition of the material may be abbreviated by "$HfAlO_x$," which does not indicate the stoichiometry of the hafnium, aluminum, and oxygen atoms.

As used herein, the term "hafnium zirconate" means and includes a material including hafnium, zirconium, and oxygen atoms. For convenience, the composition of the material may be abbreviated by "$HfZrO_x$," which does not indicate the stoichiometry of the hafnium, zirconium, and oxygen atoms.

As used herein, the term "strontium-doped hafnium oxide" means and includes a material including hafnium, strontium, and oxygen atoms. For convenience, the composition of the material may be abbreviated by "$HfSrO_x$," which does not indicate the stoichiometry of the hafnium, strontium, and oxygen atoms.

As used herein, the term "magnesium-doped hafnium oxide" means and includes a material including hafnium, magnesium, and oxygen atoms. For convenience, the composition of the material may be abbreviated by "$HfMgO_x$," which does not indicate the stoichiometry of the hafnium, magnesium, and oxygen atoms.

As used herein, the term "gadolinium-doped hafnium oxide" means and includes a material including hafnium, gadolinium, and oxygen atoms. For convenience, the composition of the material may be abbreviated by "$HfGdO_x$," which does not indicate the stoichiometry of the hafnium, gadolinium, and oxygen atoms.

As used herein, the term "yttrium-doped hafnium oxide" means and includes a material including hafnium, yttrium, and oxygen atoms. For convenience, the composition of the material may be abbreviated by "$HfYO_x$," which does not indicate the stoichiometry of the hafnium, yttrium, and oxygen atoms.

FIG. 1 illustrates a semiconductor device structure 100 having a substrate 102, an electrode 104 over the substrate 102, a FE material 106 over the electrode 104, another electrode 108 over the FE material 106, and a metal silicide material 110 over the another electrode 108. The electrode 104 may be formed from a crystalline material, such as titanium nitride, having a desired dominant crystallographic orientation, such as a dominant (111) crystallographic orientation. Thus, if the electrode material is titanium nitride, the electrode material may include a greater amount of the (111) crystallographic orientation of titanium nitride than other crystallographic orientations of titanium nitride, i.e., (001), (002), (100), (110), (200), (311), (331), (420), (422), or (511) crystallographic orientations. While examples herein describe that the electrode 104 is formed of TiN, other materials may be used as long as the material of the electrode 104 has a desired crystallographic orientation that is configured to produce the desired crystallographic orientation of the FE material 106.

The semiconductor device structure 100 may be configured as a memory cell of a FERAM. The memory cells may, for example, be arrayed in a 1 transistor/1 capacitor (1T/1C) configuration. However, other configurations of the memory cells may also be used. Additional acts to form a complete FERAM including the semiconductor device structure 100 of FIG. 1 may be performed by conventional fabrication techniques, which are not described in detail herein.

The FE material 106 may be a metal oxide material, such as a hafnium-based material, that includes a dopant. The hafnium-based material is crystallized to form the FE material 106. For simplicity and convenience, the term "hafnium-based material" is used herein to refer to the material before the material is crystallized and the term "FE material" is used to refer to the material after the material is crystallized. The FE material 106 may be hafnium oxide into which the dopant is incorporated. The dopant may be an element such as silicon, aluminum, zirconium, magnesium, strontium, gadolinium, yttrium, other rare earth elements, or combinations thereof. Examples of ferroelectric materials include, but are not limited to, hafnium silicate ($HfSiO_x$), hafnium aluminate ($HfAlO_x$), hafnium zirconate ($HfZrO_x$), strontium-doped hafnium oxide ($HfSrO_x$), magnesium-doped hafnium oxide ($HfMgO_x$), gadolinium-doped hafnium oxide ($HfGdO_x$), yttrium-doped hafnium oxide ($HfYO_x$), or combinations. While hafnium oxide does not exhibit ferroelectric properties, hafnium oxide in crystalline form and including one of the above-mentioned dopants may be ferroelectric. Hafnium oxide in crystalline form and including one of the above-mentioned dopants at the correct composition is ferroelectric. The FE material 106 may include from 0.1 mol % to about 70 mol % of the dopant. If the FE material 106 is $HfSiO_x$, the FE material 106 may be hafnium oxide including from about 4 mol % to about 6 mol % silicon, such as from about 4.4 mol % to about 5.6 mol % silicon. In one embodiment, the $HfSiO_x$ material includes 4.7 mol % silicon. If the FE material 106 is $HfAlO_x$, the FE material 106 may be hafnium oxide including from about 5 mol % to about 7 mol % aluminum. If the FE material 106 is $HfYO_x$, the FE material 106 may be hafnium oxide including from about 2.5 mol % to about 5.5 mol % yttrium. If the FE material 106 is $HfZrO_x$, the FE material 106 may be hafnium oxide including from about 40 mol % to about 70 mol % zirconium. The FE material 106 of the semiconductor device structure 100 may be in a crystalline state and have a desired crystallographic orientation.

The another electrode 108 may be formed of titanium nitride (TiN) in a crystalline state. The material of the another electrode 108 is not limited to a specific crystallographic orientation and, thus, may be formed from crystalline TiN in a (001), (002), (100), (110), (111), or (200) crystallographic orientation, or combinations thereof. The another electrode 108 may be formed of titanium nitride having the same or a different dominant crystallographic orientation as the electrode 104. While examples herein describe that the another electrode 108 is formed of TiN, other conventional materials may be used.

The metal silicide material 110 may be tungsten silicide (WSi$_x$) or other metal silicide. The metal silicide material 110 may be positioned over the another electrode 108 and the FE material 106. The metal silicide material 110 may prevent deterioration, such as oxidation, of the another electrode 108 during fabrication of the semiconductor device structure 100.

In one embodiment, the electrode 104 is formed of TiN in the dominant (111) crystallographic orientation, the FE material 106 is hafnium silicate in the dominant (200) crystallographic orientation, the another electrode material 108 is formed from TiN, and the metal silicide material 110 is tungsten silicide.

Accordingly, the present disclosure describes a FE memory cell that comprises an electrode comprising titanium nitride in a dominant (111) crystallographic orientation over a substrate. A ferroelectric material is over the electrode and another electrode material is over the ferroelectric material.

To form the semiconductor device structure 100, the electrode 104 exhibiting the desired dominant crystallographic orientation may be formed on the substrate 102 by appropriately selecting the electrode material and the formation conditions. For instance, the electrode 104 may be formed by depositing (111) crystallographic orientation titanium nitride over the substrate 102. In one embodiment, the (111) crystallographic orientation titanium nitride of the electrode 104 is formed by depositing titanium nitride by ALD, using an organometallic ALD precursor. The organometallic ALD precursor may include, but is not limited to, tetrakis-dimethylamino titanium (TDMAT). However, other organometallic ALD precursors may be used. ALD techniques for forming TiN are known in the art and, therefore, are not described in detail herein. Since the organometallic ALD precursor is free of chlorine, the resulting TiN has a low chlorine content, which reduces shielding and results in uniform electric fields in the electrode 104. The electrode 104 may be formed as a continuous material, such as at a thickness ranging from about 20 Å to about 200 Å, from about 50 Å to about 130 Å, or from about 40 Å to about 70 Å. In one embodiment, the electrode 104 thickness is about 60 Å.

While an ALD method of forming the electrode 104 from TiN using a specific ALD precursor is described herein, other methods of forming the electrode 104 may be used, as long as the resulting electrode 104 has the desired dominant crystallographic orientation, i.e., TiN in the dominant (111) crystallographic orientation. For instance, the electrode 104 with the desired dominant crystallographic orientation may alternatively be formed by depositing titanium nitride using TiAlN or by depositing titanium nitride using a titanium tetrachloride (TiCl$_4$) precursor and ammonia (NH$_3$). Process conditions for these other techniques may be selected such that the TiN of the electrode 104 is formed in the dominant (111) crystallographic orientation.

The hafnium-based material of the FE material 106 may be formed over the electrode 104. The hafnium-based material may include the hafnium oxide material with the dopant, as previously described. The hafnium-based material may be formed by conventional techniques, such as sputtering, ALD, CVD, PECVD, or MOCVD, which are not described in detail herein. Since the metal oxide material is not ferroelectric as formed, the molar concentration of the dopant in the metal oxide material may be tailored to provide the metal oxide material with ferroelectric properties. The molar concentration of the dopant in the metal oxide material may be controlled by appropriately selecting the relative ratios of metal precursor, oxygen precursor, and dopant precursor used and by varying the number of cycles conducted. The hafnium-based material, in its initial, as-formed state, may be an amorphous material.

The electrode material of the another electrode 108 may be formed over the hafnium-based material of the FE material 106. The electrode material of the another electrode 108 may be formed by conventional techniques, which are not described in detail herein. In one embodiment where the electrode material of the another electrode 108 is TiN, the TiN may be formed by a conventional Sequential Flow Deposition (SFD) process using TiCl$_4$ and NH$_3$. If both the electrode 104 and the another electrode 108 are formed from TiN, the TiN of the another electrode 108 may have the same, or a different, crystallographic orientation as the electrode 104. The electrode 104, the hafnium-based material of the FE material 106, and another electrode 108 may form a metal-insulator-metal (MIM) stack 112. During the formation of the another electrode 108, the hafnium-based material of the FE material 106 may remain in its amorphous state.

After forming the hafnium-based material of the FE material 106 and the another electrode 108, the MIM stack 112 may be subjected to an anneal process to crystallize the hafnium-based material into its desired crystallographic orientation. The annealing conditions may be determined based on the composition of the hafnium-based material and the thickness of the electrodes 104, 108. The crystallization temperature of the hafnium-based material may be a function of the amount of dopant present in the hafnium-based material. At relatively higher dopant concentrations, the crystallization temperature of the hafnium-based material may be higher than the crystallization temperature of the hafnium-based material having a lower amount of the dopant. The crystallization temperature of the hafnium-based material may range from about 800° C. to about 1000° C. By appropriately forming the electrode 104 having the desired dominant crystallographic orientation and following the anneal, the hafnium-based material may crystallize into its desired crystallographic orientation. By way of example, if the electrode 104 is formed from (111) crystallographic orientation TiN and the hafnium-based material of the FE material 106 is formed from hafnium silicate having 4.7 mol % silicon, following the anneal, the FE material 106 has an orthorhombic crystal structure with a dominant (200) crystallographic orientation. The (111) crystallographic orientation titanium nitride of the electrode 104 may provide a smooth surface that functions as a template for forming the dominant (200) crystallographic orientation of the hafnium silicate used as the FE material 106. If a material other than hafnium silicate is used as the hafnium-based material of the FE material 106, following the anneal process the FE material 106 may have an orthorhombic crystal structure. However, the resulting dominant crystallographic orientation of the FE material 106 may be a crystallographic orientation other than the (200) crystallographic orientation, depending on the hafnium-based material used.

Additional process acts to form a FERAM including the semiconductor device structure 100 of the present disclosure may be performed by conventional fabrication techniques, which are not described in detail herein.

Accordingly, the present disclosure also includes a method of forming a ferroelectric memory cell. The method comprises forming an electrode material exhibiting a desired dominant crystallographic orientation. A hafnium-based material is formed over the electrode material and the hafnium-based material is crystallized to induce formation of a ferroelectric material having a desired crystallographic orientation.

The present disclosure includes another method of forming a ferroelectric memory cell. The method comprises forming an electrode material comprising titanium nitride in a dominant (111) crystallographic orientation. An amorphous hafnium silicate material is formed over the electrode material. Another electrode material is formed over the amorphous hafnium silicate material and the amorphous hafnium silicate material is crystallized to induce formation of a dominant (200) crystallographic orientation.

During use and operation, the semiconductor device structure 100 of the present disclosure may exhibit improved cell performance. The semiconductor device structure 100 where the FE material 106 has the desired crystallographic orientation on the electrode 104 having the desired dominant crystallographic orientation exhibited intrinsically improved ferroelectric properties, such as improved cycling, improved data retention, lower ferroelectric coercivity ($E_c$), and lower electrical field saturation.

Without being bound by any theory, it is believed that by forming the electrode 104 having the desired dominant crystallographic orientation, the desired crystallographic orientation of the hafnium-based material of the ferroelectric material 106 may be formed. By forming the ferroelectric material 106 having the desired crystallographic orientation, the dipole mechanism of the ferroelectric material 106 may be oriented perpendicular to the electrodes 104, 108. For instance, the dominant (111) crystallographic orientation of TiN is believed to be smoother than any other crystallographic orientation of TiN. The dominant (111) crystallographic orientation of TiN is believed to function as a smooth template upon which the (200) crystallographic orientation of the hafnium-based material of the ferroelectric material, such as $HfSiO_x$, may be formed. In a FERAM cell having the electrode 104 formed of the dominant (111) crystallographic orientation of TiN and the FE material 106 formed of $HfSiO_x$ in the (200) crystallographic orientation, the dipole of the ferroelectric material 106 is oriented perpendicular to the electrodes 104, 108. Thus, the FERAM cell can be easily polarized and operated along its c axis.

The following examples serve to explain embodiments of the present invention in more detail. These examples are not to be construed as being exhaustive or exclusive as to the scope of the present disclosure.

EXAMPLES

Example 1

Figure 2:
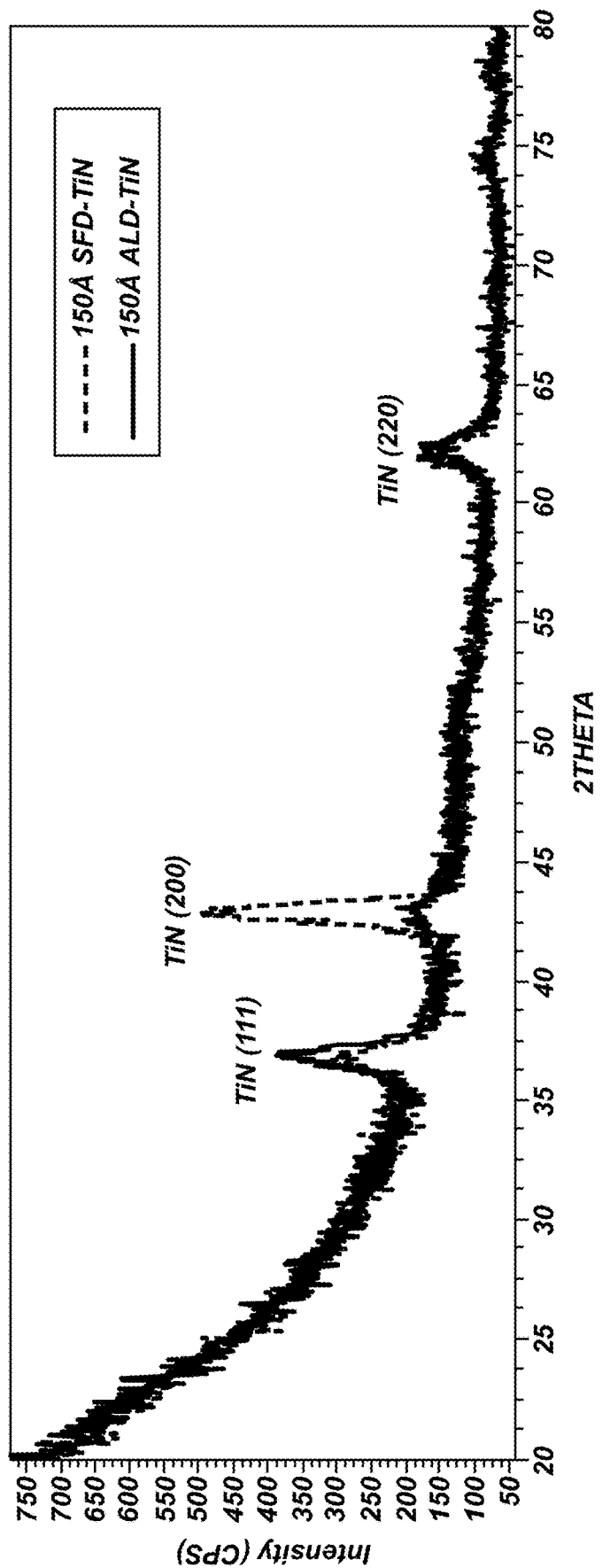
FIG. 2 shows the crystallographic orientations of TiN formed by an Atomic Layer Deposition (ALD) process and TiN formed by a conventional Sequential Flow Deposition (SFD) process, as measured by grazing incidence x-ray diffraction (GIXRD)

A 150 Å layer of titanium nitride was formed by a conventional Sequential Flow Deposition (SFD) process using $TiCl_4$ and $NH_3$. Another 150 Å layer of titanium nitride was formed by an ALD process using TDMAT as the ALD precursor. The crystal structures and crystallographic orientation of the TiN materials was determined by grazing incidence x-ray diffraction (GIXRD) analysis. The crystal structures of both TiN materials were polycrystalline cubic. However, the both materials had different crystallographic orientations. As shown in FIG. 2, the TiN formed by the ALD process had a dominant (111) crystallographic orientation with smaller peaks at the (200) and (220) crystallographic orientations, while the TiN formed by the SFD process had a dominant (200) crystallographic orientation with minor peaks at the (111) and (220) crystallographic orientations. In the TiN formed by the SFD process, the (200) crystallographic orientation was parallel or near-parallel to the substrate's surface, while in the TiN formed by the ALD process, the (111) crystallographic orientation was parallel or near-parallel to the substrate's surface.

Figure 3:
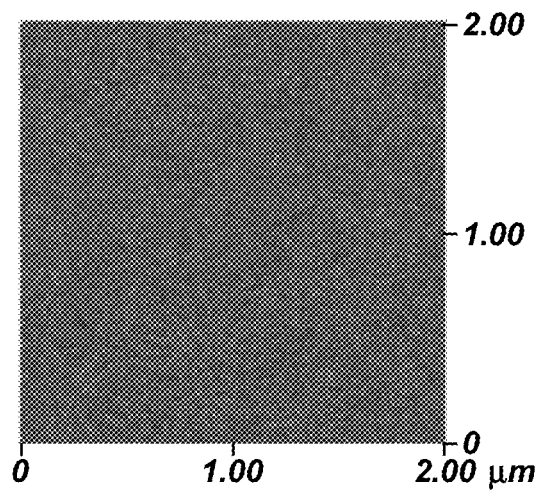
FIGS. 3 and 4 are micrographs showing the roughness of TiN formed by an ALD process compared to that of TiN formed by the SFD process.
Figure 4:
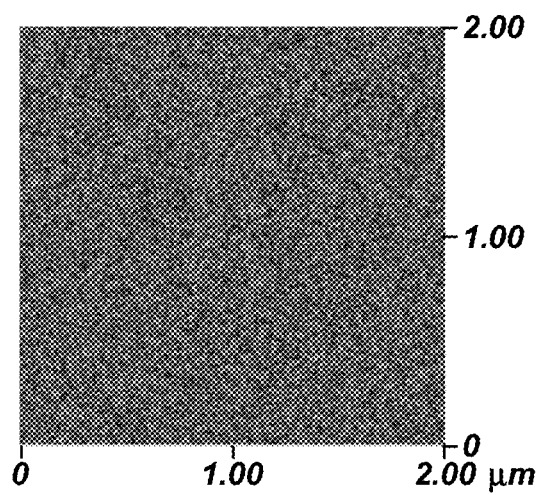

The roughness of the two titanium nitride materials was also different. The roughness of the materials was measured by conventional atomic force microscopy (AFM) techniques. As shown in FIGS. 3 and 4, the TiN formed by the ALD process was significantly smoother than the TiN formed by the SFD process. The TiN formed by the ALD process had a root-mean-square (RMS) roughness of 4.0 A while the TiN formed by the SFD process had an RMS of 11.1 A.

Example 2

Test wafers including TiN materials formed by different techniques were prepared. The control wafer included a polysilicon substrate, a 50 Å TiN material (a bottom electrode) over the substrate, a 100 Å $HfSiO_x$ material over the TiN material of the bottom electrode, a 100 Å TiN material (a top electrode) over the $HfSiO_x$ material, and a 600 Å $WSi_x$ over the TiN material of the top electrode. The TiN of the bottom electrode had a dominant (200) crystallographic orientation. The $HfSiO_x$ material included 4.7 mol % silicon. The TiN of the bottom and top electrodes was formed by a conventional Sequential Flow Deposition (SFD) process using $TiCl_4$ and $NH_3$. The control wafer is referred to herein and in the drawings as wafer 5.

In the sample wafers, the TiN material of the bottom electrode was formed to 60 Å or 125 Å by an ALD process using TDMAT as the ALD precursor. The sample wafer having the 125 Å TiN material of the bottom electrode is referred to herein and in the drawings as wafer 5 and the 60 Å TiN material of the bottom electrode is referred to herein and in the drawings as wafer 18. The TiN of the bottom electrode had a dominant (111) crystallographic orientation. The sample wafers included a polysilicon substrate, a 100 Å $HfSiO_x$ material (including 4.7 mol % silicon) over the TiN material of the bottom electrode, a 100 Å TiN material (a top electrode) over the $HfSiO_x$ material, and a 600 Å $WSi_x$ over the TiN material of the top electrode. The 100 Å TiN material of the top electrode was formed by a conventional SFD process.

Figure 5:
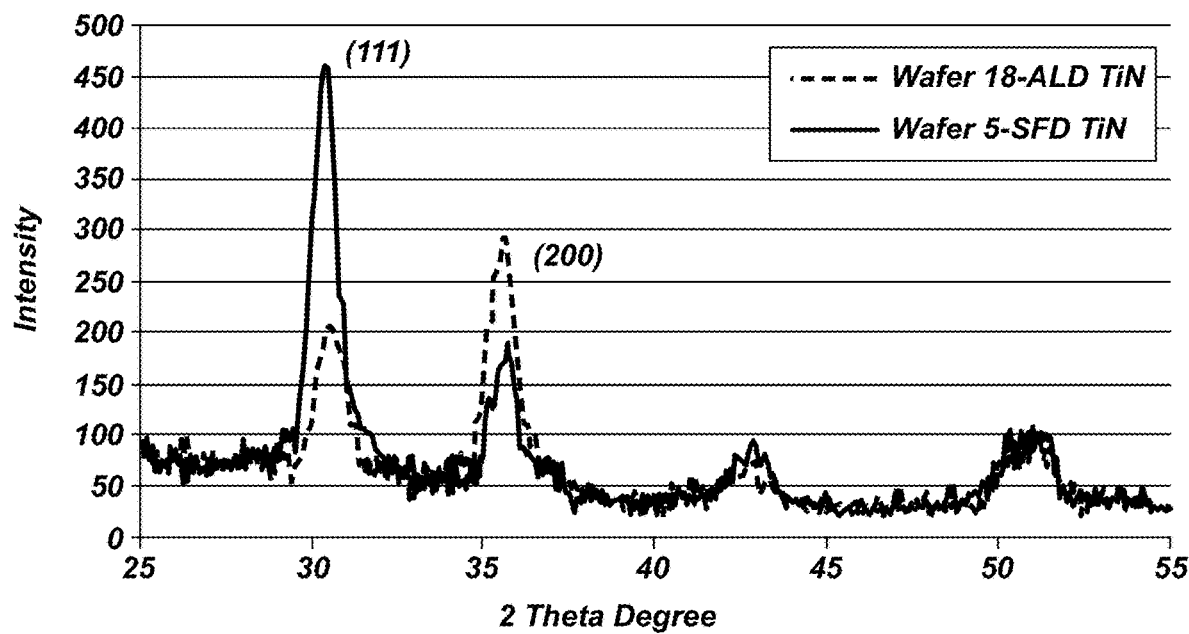
FIG. 5 shows the crystallographic orientations of hafnium silicate, as measured by GIXRD, for a test wafer and a control wafer.

The control and sample wafers including MIM stack 112 of material as described above were subjected to an anneal at 1000° C. Following the anneal, the $HfSiO_x$ material over the TiN material formed by the ALD process (wafer 18) exhibited an orthorhombic crystal structure and a dominant (200) crystallographic orientation, as shown in FIG. 5. In contrast, the $HfSiO_x$ material over the TiN material formed by the SFD process (wafer 5) exhibited a dominant (111) crystallographic orientation.

Figure 6:
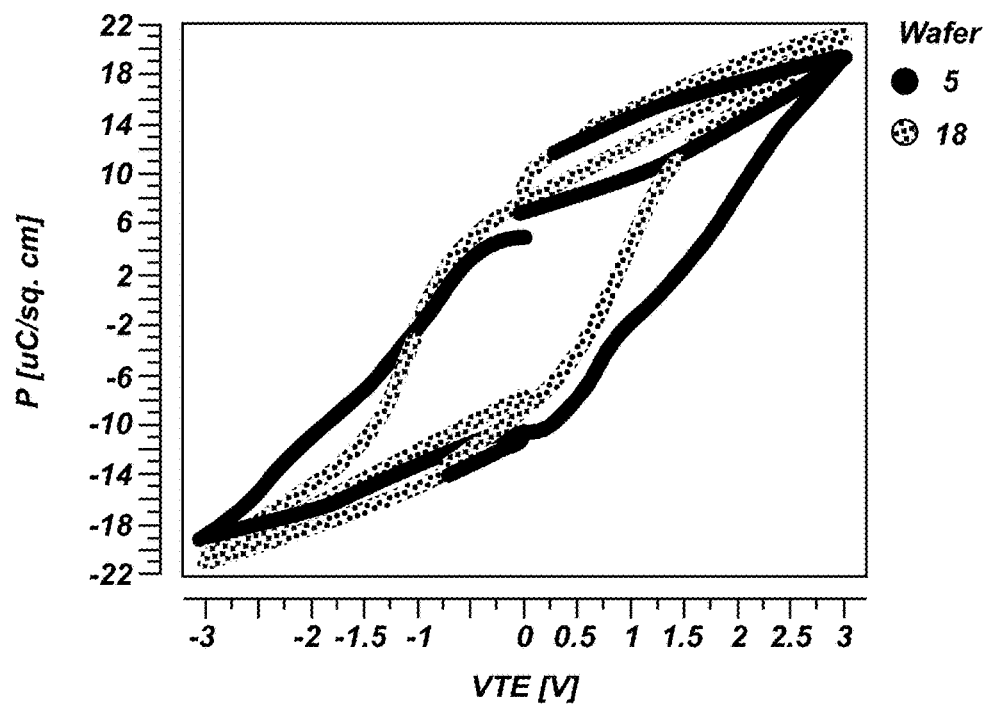
FIG. 6 is a Positive Up Negative Down (PUND) hysteresis conducted at 100 cycles for the test wafer and control wafer.

The performance of the control and sample wafers was also determined. Data retention characteristics were evaluated by a conventional Positive Up Negative Down (PUND) pulse technique at 100 cycles. As shown in FIG. 6, wafer 18 had a lower ferroelectric coercivity ($E_c$) of 1.6 V, compared to $E_c$ (2.8 V) of the control wafer (wafer 5). The lower $E_c$ implies the voltage needed to operate a device including the wafer 18 would be less than that for wafer 5, and a device including wafer 18 can be operated at lower voltage than wafer 5. Thus, wafer 18 demonstrated a much healthier ferroelectric/PUND hysteresis behavior with lower $E_c$ and lower electrical field saturation.

Figure 7:
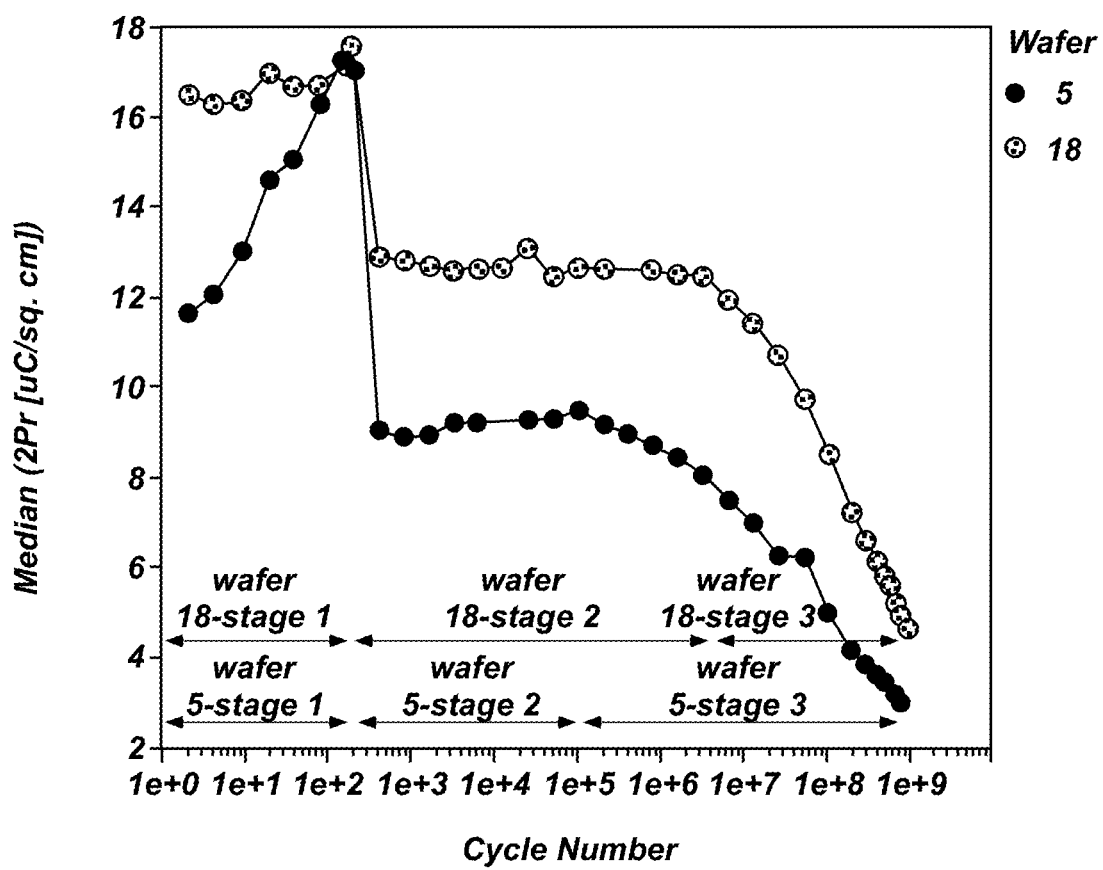
FIG. 7 is a plot of median 2Pr (remanent polarization, which is the sum of the magnitudes of the positive and negative polarization at E=0) as a function of cycle number for the test wafer and control wafer.

FIG. 7 is a plot of median 2Pr as a function of cycle number, where Stage 1 is the initial polling state, Stage 2 is the lifetime state, and Stage 3 is the degradation state. As shown in FIG. 7, wafer 18 exhibited extended cycling before degradation compared to wafer 5 (the control wafer). Wafer 5 showed polarization fatigue at about $1\times10^5$ cycles while wafer 18 showed an improvement of almost 1.5 orders of magnitude greater ($3\times10^6$ cycles) before degradation began to occur. In addition, wafer 18 had an average 2Pr plateau of about 12 uC/sq cm, which is 30% memory window/sensing margin improvement compared with wafer 5, having an average 2Pr plateau of about 9 uC/sq cm. Wafer 18 also showed an improvement in initial cycling, as evidenced by the lower slope of a line (not shown) fitting the data measured during Stage 1. The initial cycling (i.e., Stage 1) of wafer 18 was more stable than that of wafer 5, implying that the dipole of the FE material of wafer 18 is oriented correctly to the dipole of the electrodes and the resulting device is able to begin writing quickly. In contrast, wafer 5 needs additional time for the dipole of its FE material to align correctly with the dipole of its electrodes, which is indicated by the steep slope of the line in Stage 1. Thus, wafer 18 exhibited improved initial cycling, a greater 2Pr, and an improved extended cycling before degradation occurred.

These results show that wafer 18 (having the orthorhombic $HfSiO_x$ crystal structure and a dominant (200) crystallographic orientation on the dominant (111) crystallographic orientation TiN) had intrinsically improved ferroelectric properties, such as improved 2Pr values, improved cycling, improved $E_c$, and lower electrical field saturation, compared to the control wafer.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A semiconductor device comprising:
a crystalline material comprising a dominant crystallographic orientation adjacent to a ferroelectric material, the dominant crystallographic orientation of the crystalline material formulated to produce a dominant crystallographic orientation of the ferroelectric material; and
another crystalline material adjacent to the ferroelectric material.

2. The semiconductor device of claim 1, wherein the ferroelectric material comprises a doped hafnium oxide material.

3. The semiconductor device of claim 1, wherein the crystalline material comprises titanium nitride.

4. The semiconductor device of claim 3, wherein the crystalline material comprises a dominant (111) crystallographic orientation.

5. The semiconductor device of claim 1, wherein the ferroelectric material comprises a dominant (200) crystallographic orientation of a hafnium oxide material.

6. A semiconductor device comprising:
a crystalline material comprising a dominant crystallographic orientation adjacent to a hafnium oxide material comprising a dominant crystallographic orientation; and
another crystalline material adjacent to the hafnium oxide material.

7. The semiconductor device of claim 6, wherein the crystalline material comprises a dominant (111) crystallographic orientation and the hafnium oxide material comprises a dominant (200) crystallographic orientation.

8. The semiconductor device of claim 6, wherein the hafnium oxide material comprises a dominant (200) crystallographic orientation.

9. The semiconductor device of claim 6, wherein the crystalline material comprises titanium nitride.

10. The semiconductor device of claim 6, wherein the another crystalline material comprises the same dominant crystallographic orientation as the crystalline material.

11. The semiconductor device of claim 6, wherein the another crystalline material comprises a different dominant crystallographic orientation than the crystallographic orientation of the crystalline material.

12. The semiconductor device of claim 6, wherein the crystalline material and the another crystalline material comprise titanium nitride, the titanium nitride of the crystalline material and the another crystalline material independently selected from the group consisting of a (001) crystallographic orientation, a (002) crystallographic orientation, a (100) crystallographic orientation, a (110) crystallographic orientation, a (111) crystallographic orientation, and a (200) crystallographic orientation.

13. A semiconductor device comprising:
titanium nitride comprising a (111) crystallographic orientation adjacent to a hafnium-based ferroelectric material comprising a (200) crystallographic orientation; and
an electrode material adjacent to the hafnium-based ferroelectric material.

14. The semiconductor device of claim 13, wherein the titanium nitride comprises a dominant (111) crystallographic orientation and the hafnium-based ferroelectric material comprises a dominant (200) crystallographic orientation.

15. The semiconductor device of claim 13, wherein the titanium nitride comprises a dominant (111) crystallographic orientation and the hafnium-based ferroelectric material comprises a doped hafnium oxide material.

16. The semiconductor device of claim 15, wherein the doped hafnium oxide material comprises from 0.1 mol % to about 70 mol % of a dopant.

17. The semiconductor device of claim 13, wherein the hafnium-based ferroelectric material comprises orthorhombic hafnium silicate.

18. The semiconductor device of claim 13, wherein the hafnium-based ferroelectric material comprises hafnium silicate, hafnium aluminate, hafnium zirconate, strontium-doped hafnium oxide, magnesium-doped hafnium oxide, gadolinium-doped hafnium oxide, yttrium-doped hafnium oxide, or combinations thereof.

* * * * *

UNITED STATES PATENT AND TRADEMARK OFFICE
CERTIFICATE OF CORRECTION

PATENT NO. : 11,043,502 B2
APPLICATION NO. : 16/550983
DATED : June 22, 2021
INVENTOR(S) : Qian Tao et al.

Page 1 of 1

It is certified that error appears in the above-identified patent and that said Letters Patent is hereby corrected as shown below:

In the Specification
Column 5, Line 67, change "(TiCh$_4$)" to --(TiCl$_4$)--

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*